(12) United States Patent
Onobori et al.

(10) Patent No.: US 7,290,331 B2
(45) Date of Patent: Nov. 6, 2007

(54) COMPONENT MOUNTING APPARATUS AND COMPONENT MOUNTING METHOD

(75) Inventors: Shunji Onobori, Kadoma (JP); Shozo Minamitani, Kadoma (JP); Shuichi Hirata, Kadoma (JP); Tomoaki Nakanishi, Kadoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/426,719

(22) Filed: Jun. 27, 2006

(65) Prior Publication Data

US 2007/0006453 A1 Jan. 11, 2007

(30) Foreign Application Priority Data

Jul. 7, 2005 (JP) ............................. 2005-198332

(51) Int. Cl.
    *H05K 3/30* (2006.01)
(52) U.S. Cl. .............................. 29/832; 29/825; 29/833; 29/834
(58) Field of Classification Search ................. 29/832, 29/833, 834, 840, 825
See application file for complete search history.

(56) References Cited

U.S. PATENT DOCUMENTS

| | | | | |
|---|---|---|---|---|
| 4,521,828 A | * | 6/1985 | Fanning | ...................... 361/715 |
| 4,617,708 A | * | 10/1986 | Fanning | ...................... 29/25.42 |
| 4,884,237 A | * | 11/1989 | Mueller et al. | ................ 365/63 |
| 6,462,408 B1 | * | 10/2002 | Wehrly, Jr. | ................... 257/686 |
| 6,572,387 B2 | * | 6/2003 | Burns et al. | .................. 439/69 |
| 6,608,763 B1 | * | 8/2003 | Burns et al. | ................. 361/790 |
| 6,919,626 B2 | * | 7/2005 | Burns | ........................ 257/686 |
| 7,066,741 B2 | * | 6/2006 | Burns et al. | .................. 439/69 |
| 7,096,427 B2 | * | 8/2006 | Van De Streek et al. | ... 715/719 |
| 7,098,073 B1 | * | 8/2006 | Mangrum | ................... 438/107 |

FOREIGN PATENT DOCUMENTS

JP  3132353  11/2000

\* cited by examiner

*Primary Examiner*—Carl J. Arbes
(74) *Attorney, Agent, or Firm*—Pearne & Gordon LLP

(57) ABSTRACT

In a component mounting apparatus in which integrated components having a chip-on-chip structure are formed by mounting upper chips on lower chips. The lower chips picked up from a component carrying-in unit by a component carrying-in head are placed on a mounting stage, and the upper chips picked up from a second component tray by a component transporting head are vertically flipped around a rotation axis and transferred to a mounting head at a component transferring position, then the upper chips held by the mounting head are descended and mounted by solder bonding on the lower chips held by the mounting stage at a component mounting position. Integrated components formed by mounting are carried out of the mounting stage by the component transporting head and stored in a first component tray in a component storing unit.

2 Claims, 6 Drawing Sheets

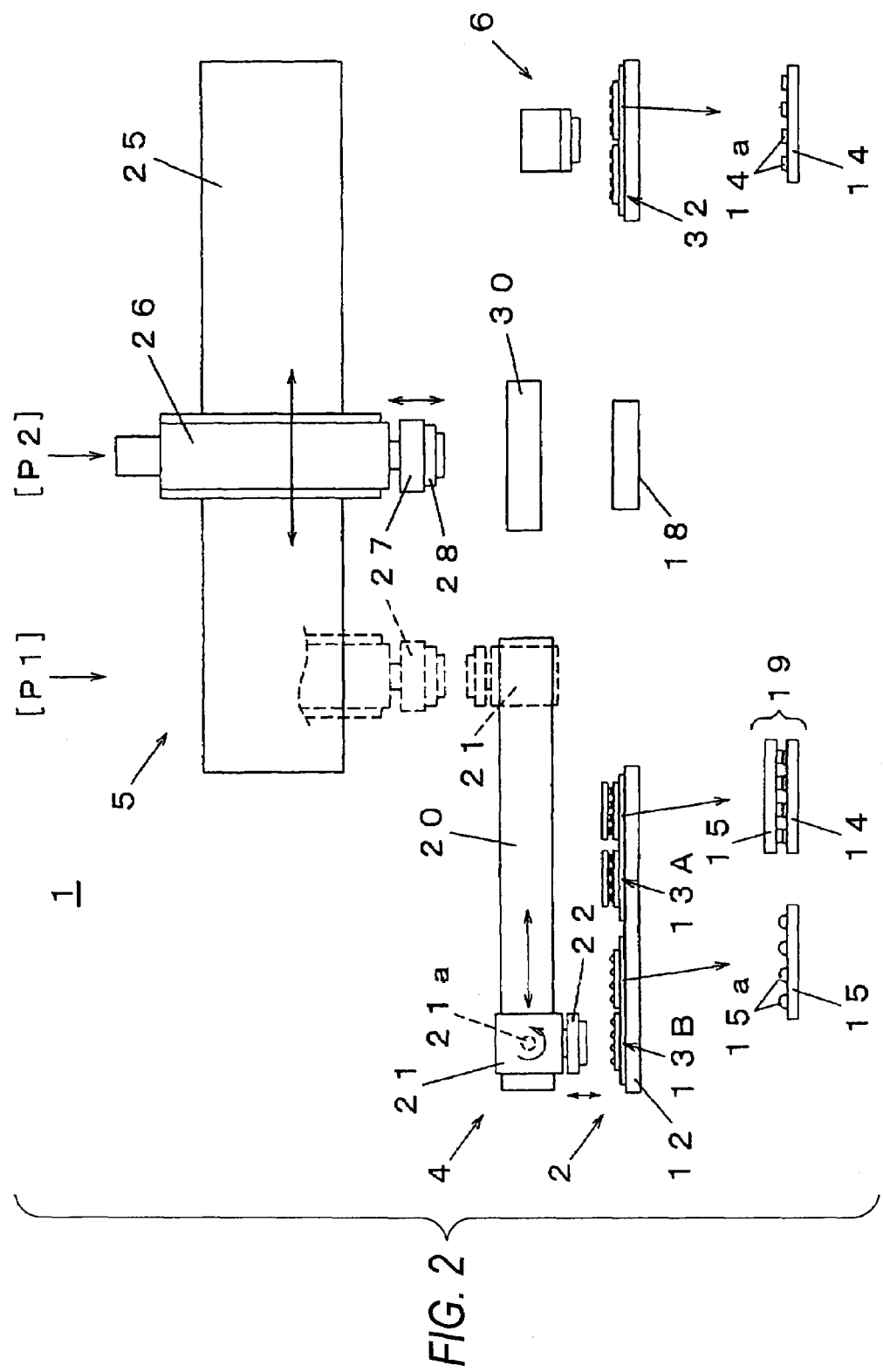

COMPONENT MOUNTING APPARATUS AND COMPONENT MOUNTING METHOD

BACKGROUND OF THE INVENTION

1. Field of the Invention

This invention relates to a component mounting apparatus and a component mounting method in which another component is mounted on one component in a stacked manner.

2. Related Art

In field of manufacturing electronic devices, component mounting operations are performed such that semiconductor chips are mounted on a work like circuit boards etc. In such a component mounting operation, there are two operations: a transporting and placing operation where semiconductor chips in which connection terminals such as solder bumps are formed are picked up from a component feeding unit and placed on a board, and a bonding operation where the connection terminals of the semiconductors are bonded to circuit terminals on the board. For an apparatus to perform such component mounting operations, there is known conventionally a component mounting apparatus includes a component flipping mechanism which picks up semiconductor chips from the component feeding unit and flips them vertically, and a mounting head which mounts the semiconductor chips transferred from the component flipping mechanism on the board (see, for example, Japanese Patent No. 313253).

According to the recent progress in downsizing and sophisticating electronic devices, it has been required to further improve board density mounted in electronic devices. To respond to such the requirement of high density mounting, semiconductor devices with so-called chip-on-chip (COC) structure made by stacking plural semiconductor chips have been widely adopted. Such a semiconductor device is manufactured by mutually bonding bumps on circuit forming faces opposed each other in a pair of semiconductor chips.

However, since the component mounting apparatus shown in the above patent publication is configured for applications in which semiconductor chips are transported and mounted on a board which has a relatively large size such that the board can be easily handled, the apparatus is not always suitable to bond a pair of semiconductor chips having almost the same size to each other. Accordingly, there has been desired a component mounting apparatus and a component bonding method which can effectively perform a component mounting operation to manufacture semiconductor devices having a chip-on-chip structure.

SUMMARY OF THE INVENTION

This invention has been made in view of the above circumstances, and an object of the invention is to provide a component mounting apparatus and a component bonding method which can effectively perform a component mounting operation to manufacture semiconductor devices having a chip-on-chip structure.

A component mounting apparatus of the invention is: a component mounting apparatus which mounts a second component on a first component, comprising:

a component feeding unit which feeds a second component;

a mounting stage on which a first component is placed; and a mounting unit which holds and mounts the second component on the first component placed on the mounting stage by a mounting head;

wherein the second component is picked up from the component feeding unit by a component transporting unit and transferred to the mounting head, and the second component mounted on the first component is held by the component transporting unit and carried out of the mounting stage together with the first component.

A component mounting method of the invention is: a component mounting method of mounting a second component on a first component, comprising the steps of:

a placing step of placing a first component on a mounting stage;

a holding step of holding a second component which is transferred to a mounting head by a component transporting unit;

a mounting step of mounting the second component held by the mounting head on the first component placed on the mounting stage; and a carrying-out step of carrying the second component mounted on the first component out of the mounting stage together with the first component by holding the component transporting unit.

According to the invention, in the component mounting operation that the second component is mounted on the first component, the first component is transported to the mounting stage by the component transporting unit, and then the second component transferred by the component transporting unit is mounted on the first component by the mounting head. Further, the second component after mounted is carried out together with the first component by the component transporting unit. By this construction, it is possible to effectively perform component mounting operation for manufacturing semiconductor devices having COC structure.

BRIEF DESCRIPTION OF THE DRAWINGS

FIG. 2 is a front view showing the component mounting apparatus according to the embodiment of the present invention.

DETAILED DESCRIPTION OF THE PREFERRED EMBODIMENTS

Figure 1:
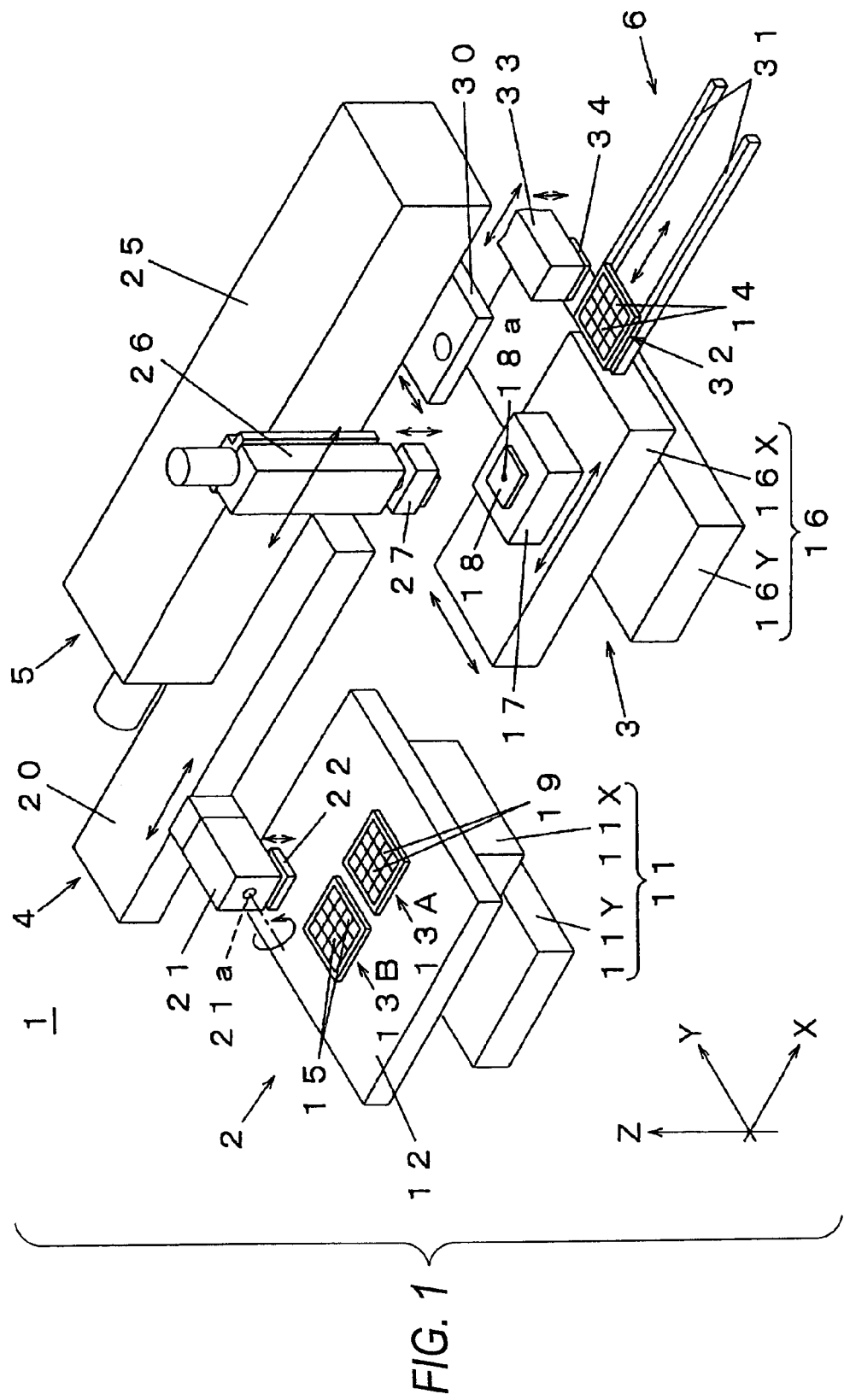
FIG. 1 is a perspective view showing a component mounting apparatus according to one embodiment of the present invention.

A preferred embodiment of the present invention will now be described in detail with reference to the drawings. FIG. 1 is a perspective view showing a component mounting apparatus according to one embodiment of the present invention; FIG. 2 is a front view showing the component mounting apparatus according to the embodiment of the present invention; and FIGS. 3A through 4D are process explanatory views process of a component mounting method according to the embodiment of the present invention.

Referring to FIGS. 1 and 2, the structure of a component mounting apparatus 1 will be described below. The component mounting apparatus 1 is served for manufacturing integrated components (semiconductor devices) having COC structure made by mounting semiconductor chips with substantially the same size in a directly stacked manner. In FIG. 1, the component mounting apparatus 1 is configured so that a component feeding unit 2 and a component positioning unit 3 are arranged serially in X direction (component transportation direction), and above these units, a component transporting unit 4 and a component mounting unit 5 are arranged so as to extend in X direction. On right side of the component positioning unit 3, a component carrying-in unit 6 is disposed for carrying lower chips 14 each of which is first component of the invention into the component positioning unit 3.

Construction of these units will be described below. The component feeding unit 2 is provided by mounting a component storing table 12 on a positioning table 11 in which an X-axis table 11X and a Y-axis table 11Y are combined. On an upper face of the component storing table 12, a first component tray 13A (first component feeding unit) and a second component tray 13B (second component feeding unit) are held. The upper chips 15, each of which is second component of the invention, and the integrated components 19 that are formed by the upper chips 15 mounted on the lower chips 14 are regularly arranged in a grid pattern and stored in the second component tray 13B and the first component tray 13A, respectively (See FIG. 2).

By driving the positioning table 11, the first component tray 13A and the second component tray 13B on the component storing table 12 are horizontally moved in X direction and Y direction to thereby be positioned with respect to the component transporting unit 4. Using this construction, the upper chips 15 are picked up by the component transporting unit 4 and fed to the component mounting unit 5. Thus, the second component tray 13B constitutes the component feeding unit which feeds the upper chips 15 as the second component.

The component carrying-in unit 6 which is disposed on right side of the component positioning unit 3 includes a component storage tray 32 which is movable in X direction by a transportation conveyer 31 and a component carrying-in head 33 on which a component holding nozzle 34 is mounted. The component carrying-in head 33 can reciprocate in X direction and perform ascending and descending operation by a transporting head actuating mechanism (not-shown). Using this construction, the component carrying-in head 33 can conduct a carrying operation of the components between a mounting stage 18 located at a component mounting position [P2] and the component storage tray 32 located at left end of the transportation conveyer 31, so that the lower chips 14 on the component storage tray 32 are carried in and placed on the mounting stage 18. Thus the component mounting head 33 constitutes a component carrying-in unit which places the lower chips 14 on the mounting stage 18.

Each of the lower chips 14 and each of the upper chips 15 are rectangular components having almost the same size compared to each other. As shown in FIG. 2, connection terminals 14a are provided on a circuit forming face on each of the lower chips 14, and solder bumps 15a are provided on a circuit forming face on each of the upper chips 15. Both of the lower chips 14 and the upper chips 15 are stored in the component storage tray 32 and the second component tray 13B respectively with so-called "face-up position" that the circuit forming faces are faced the upper side. The component mounting apparatus 1 perform a component mounting operation of stackingly mounting the upper chips 15 picked up from the second component tray 13B on the lower chips 14 carried from the component carrying-in unit 6. This mounting operation is performed by placing the upper chips 15 on the lower chips 14 and solder bonding the solder bumps 15a to the connection terminals 14a in each pair of the upper chip 15 and the lower chip 14. Incidentally, the bonding method of the upper chip 15 and the lower chip 14 is not limited to the solder bonding between the solder bumps 15a and the connection terminals 14a, and bonding with adhesives or resins such as Anisotropic Conductive Adhesive (ACF) may be used. Ultra-sonic bonding may be also used. Further, material of the bumps, in a case such components are provided with bumps, is not limited to solder and gold, silver, cupper, indium and the like may be selected in a suitable manner.

The component positioning unit 3 is configured by mounting a movable block 17 on a positioning table 16 in which an X-axis table 16X and a Y-axis table 16Y are combined. The mounting stage 18 on which the lower chips 14 are placed is provided on an upper face of the movable block 17. A suction hole 18a is formed on the mounting stage 18 so that the lower chips 14 are sucked and held on the mounting stage 18 by vacuum suction from the suction hole 18a in a state that the lower chip 14 is placed on the mounting stage 18.

By driving the positioning table 16, the mounting stage 18 is moved horizontally in X direction and Y direction. Accordingly, the lower chip 14 on the mounting stage 18 can be positioned with respect to the component mounting unit 5. In addition, moving the mounting stage 18 in X direction, the mounting stage 18 can be located both at a component transferring position [P1] at which the component is transferred between the mounting stage 18 and the component transporting unit 4 and the component mounting position [P2] at which the mounting operation is conducted by the component mounting unit 5.

The component transporting unit 4 is configured so as to be capable of reciprocating a component transporting head 21 in X direction with a transportation block 20. The component transporting head 21 includes a component holding nozzle 22 which can hold the upper chip 15. The component holding nozzle 22 is configured to be capable of ascending and descending by an actuating mechanism installed in the component transporting head 21. Further the component transporting head 21 is made rotatable 180 degrees around a rotation axis 21 extending in Y direction. By this construction, the component holding nozzle 22 can be operated in two postures of upward direction and downward direction.

Namely, the component transporting head 21 can pick up the upper chip 15 from the component feeding unit 2 using the component holding nozzle 22 and also can flip the upper chip 15 vertically, by rotating the component holding nozzle 22 by 180 degrees so that the component holding nozzle 22 is turned to the upward face posture.

The component mounting unit 5 is configured to be capable of reciprocating a mounting head 27 in X direction with a transportation table 25. The mounting head 27 is configured to ascend and descend by a head actuation mechanism 26, and includes a component holding nozzle 28 to hold the upper chip 15 in a "face-down position". By moving the component transporting head 21 that have picked up the upper chip 15 from the second component tray 13B to the component transferring position [P1] as shown in FIG. 2 and flipping the component transporting head 21 vertically, and simultaneously by moving the mounting head 27 to the component transferring position [P1], the upper chip 15 held by the component holding nozzle 22 can be transferred to the mounting head 27.

At this time, the upper chip 15 that was in the face-up position facing the solder bumps 15a upward on the second component tray 13B is transferred to the mounting head 27 in the face-down position facing the solder bumps 15a downward, being flipped vertically by the component transporting head 21. Thus, the component transporting unit 4 constitutes a component transporting unit which transfers the upper chip 15 picked up from the second component tray 13B to the mounting head 27. Then, after receiving the upper chip 15, the mounting head 27 moves to the component mounting position [P2] and conducts descending and ascending operation so that the upper chip 15 is mounted on the lower chip 14 placed on the mounting stage 18.

The mounting head 27 includes a heating device inside thereof, so that the upper chip 15 can be heated through the component holding nozzle 28. In the mounting operation in which the upper chip 15 held by the mounting head 27 is descended toward the lower chip 14 placed on the mounting stage 18 so that the solder bumps 15a are brought into contact with the lower chips 14, by heating the upper chips 15 with the mounting head 27, the solder bumps 15a are melted to bonded to the connection terminals 14a by solder bonding. Accordingly, the upper chip 15 is mounted on the lower chip 14. The component mounting unit 5 constitutes a mounting unit which holds the upper chip 15 by the mounting head 27 and mounts the upper chip 15 on the lower chip 14 placed on the mounting stage 18.

The integrated component 19 that has been formed by mounting the upper chip 15 on the lower chip 14 is carried out of the mounting stage 18 by the component transporting head 21 and stored in the first component tray 13A of the component feeding unit 2. In other words, in this embodiment, the upper chip 15 mounted on the lower chip 14 is configured to be carried out of the mounting stage 18 together with the lower chip 14 by the above-described component transporting unit.

A recognizing unit 30 is arranged diagonally above the component positioning unit 3. The recognizing unit 30 includes dual view optical systems which can image both of an upward view and a downward view in a single imaging operation and is configured to be movable in Y direction by a movement mechanism (not-shown). In a state that the lower chip 14 is place on the mounting stage 18 and that the mounting head 27 holding the upper chip 15 by suction is located directly above the mounting stage 18, the recognizing unit 30 is interposed between the mounting stage 18 and the mounting head 27 so that the lower chip 14 and the upper chip 15 can be imaged by the same imaging operation for recognition. The recognizing unit 30 constitutes a recognizing unit of the invention which optically recognizes the lower chip 14 on the mounting stage 18 and the upper chip 15 held by the mounting head 27.

Figure 3A:
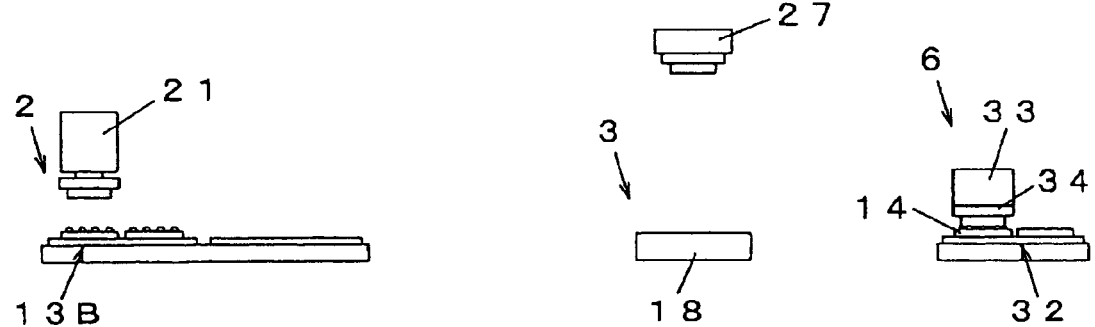
FIG. 3 is a process explanatory view showing a component mounting method according to the embodiment of the present invention.

Next, referring to FIGS. 3A to 4, a component mounting operation performed by the component mounting apparatus 1 will be described. As shown in FIG. 3A, the component carrying-in head 33 is moved above the component storage tray 32 of the component carrying-in unit 6. Then, the component holding nozzle 34 is positioned to the lower chip 14 as a mounting object and descended to hold the lower chip 14 from the circuit formation side thereof by suction. At this point, the component transporting head 21 is in a stand-by position above the second component tray 13B in the component feeding unit 2.

Figure 3B:
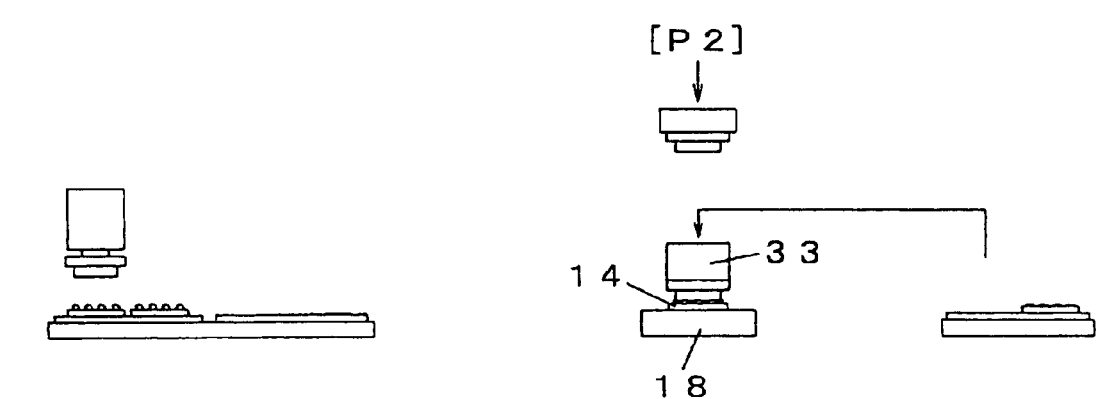
Figure 3C:
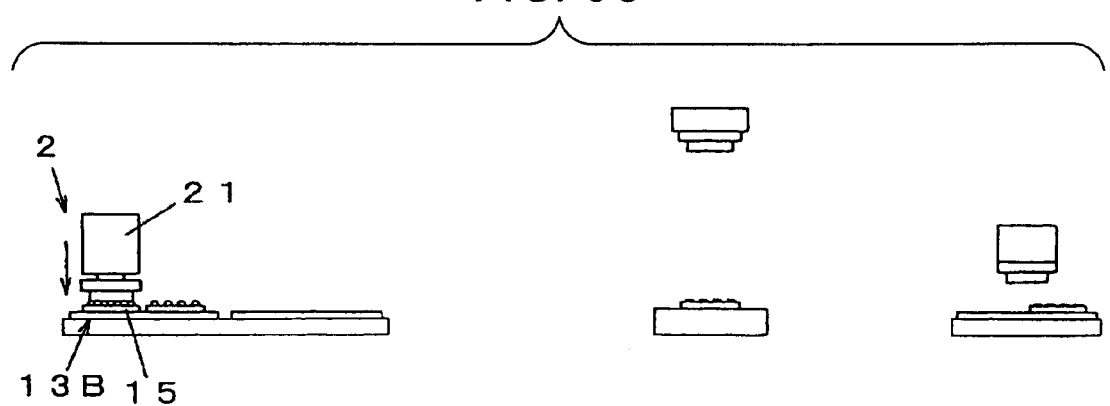

Subsequently, the lower chip 14 is picked up from the component storage tray 32 by the component carrying-in head 33, and moved to the component mounting position [P2] in the component positioning unit 3 as shown in FIG. 3B Then the lower chip 14 is placed on the mounting stage 18 (placing step). The component transporting head 21 that has been in the stand-by position in the component feeding unit 2 is descended to hold the upper chip 15 on the second component tray 13B.

Figure 3D:
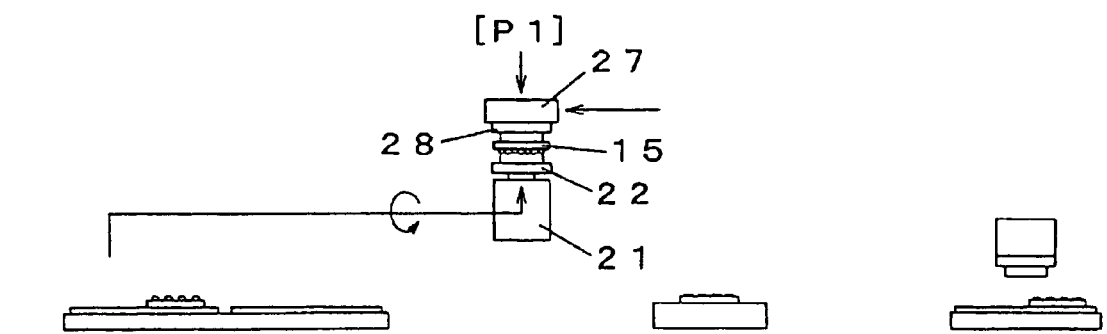

After that, the component transporting head 21 picks up the upper chip 15 held through the component holding nozzle 22 from the second component tray 13B, and moves toward the component transferring position [P1]. In a middle of the movement to the component transferring position [P1], the component transporting head 21 is rotated 180 degrees to flip vertically the upper chip 15 held through the component holding nozzle 22 as shown in FIG. 3D. Then by ascending the component transporting head 21 from a lower side of the mounting head 27, the component holding nozzle 28 of the mounting head 27, which have already moved from the component mounting position [P2] to the component transferring position [P1], holds the upper chip 15 in the face-down position, facing the circuit forming face downward (holding step).

Figure 4A:
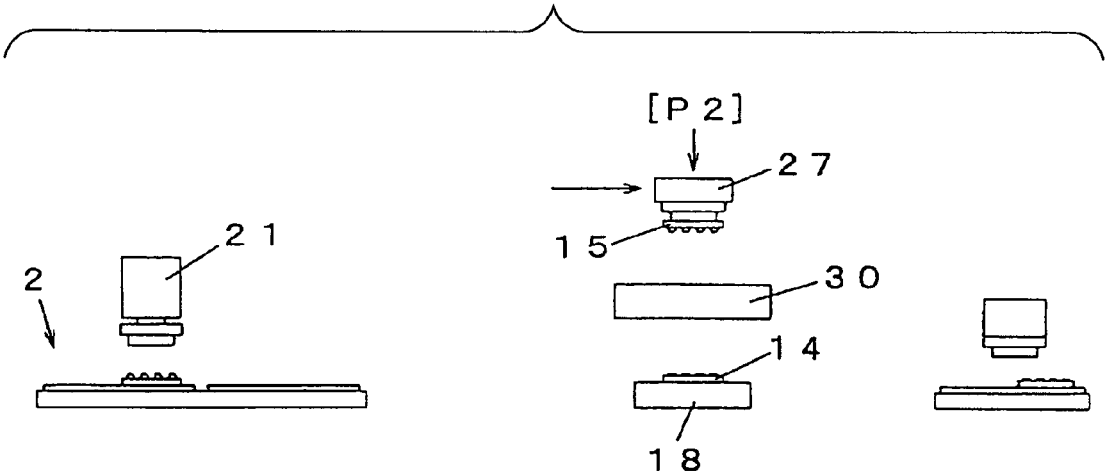
FIG. 4 is a process explanatory view showing the component mounting method according to the embodiment of the present invention.

Further, after moving the mounting head 27 holding the upper chip 15 to the component mounting position [P2], the recognizing unit 30 is interposed between the mounting stage 18 and the mounting head 27, as shown in FIG. 4A, so that the recognizing unit 30 images the lower chip 14 and the upper chip 15 by the same imaging operation using the dual view optical systems provided in the recognizing unit 30. Imaging result is processed for recognition by recognition means (not-shown) so that the connection terminals 14a of the lower chip 14 and the solder bumps 15a of the upper chip 15 are recognized. Based on this recognition result, positional inconsistency between the connection terminals 14a and the solder bumps 15a is detected.

Figure 4B:
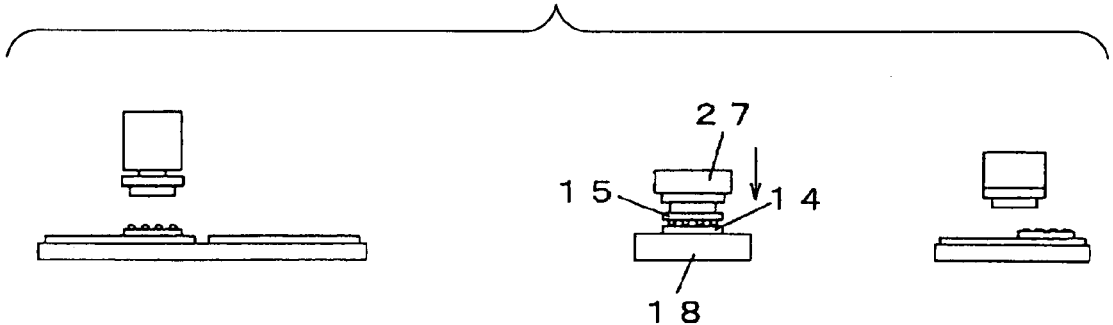

After the recognizing unit 30 is retreated from the position under the mounting head 27, the mounting head 27 is descended to place the upper chip 15 on the lower chip 14 as shown in FIG. 4B. At this point, by controlling the positioning table 16 taking account of the positional inconsistency between the connection terminals 14a and the solder bumps 15a detected in the previous recognizing step, the solder bumps 15a are positioned correctly to the connection terminals 14a.

Then, the upper chip 15 is heated by the mounting head 27, so that the upper chip 15 is mounted on the lower chips 14 by melting the solder bumps 15a and being bonded to the connection terminals 14a (mounting step). As a result, the integrated component 19 is formed by mounting the upper chips 15 on the lower chips 14. At this time, height of the mounting head 27 is controlled to keep a clearance between the upper chip 15 and the lower chip 14 adequately, so that troubles caused by flowing molten solder of the solder bumps 15a unintended way can be prevented.

Figure 4C:
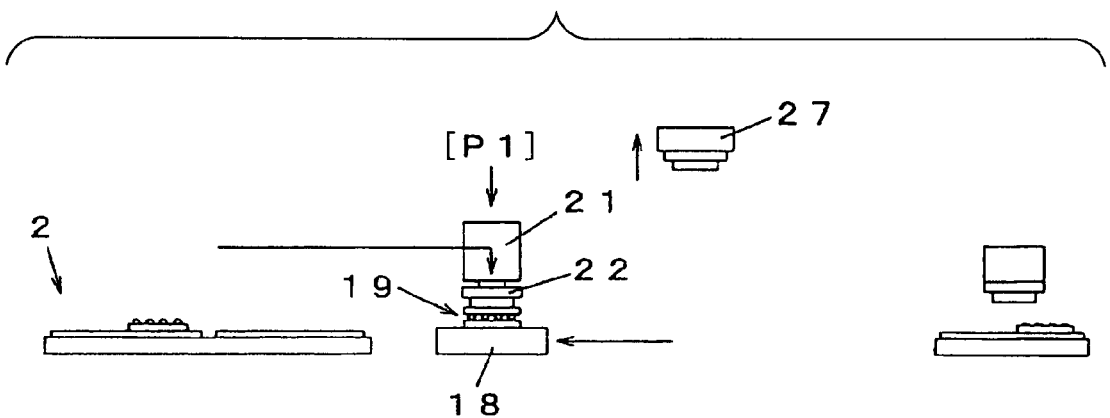

After completed the solder bonding, the suction holding of the lower chip 14 by the mounting stage 18 is released and the mounting head 27 is ascended so that transporting the integrated component 19 by the component transporting head 21 is started. Namely, as shown in FIG. 4C, the mounting stage 18 that holds the integrated component 19 is moved to the component transferring position [P1] and then the component transporting head 21 is moved to the component transferring position [P1] and descended toward the mounting stage 18.

Figure 4D:
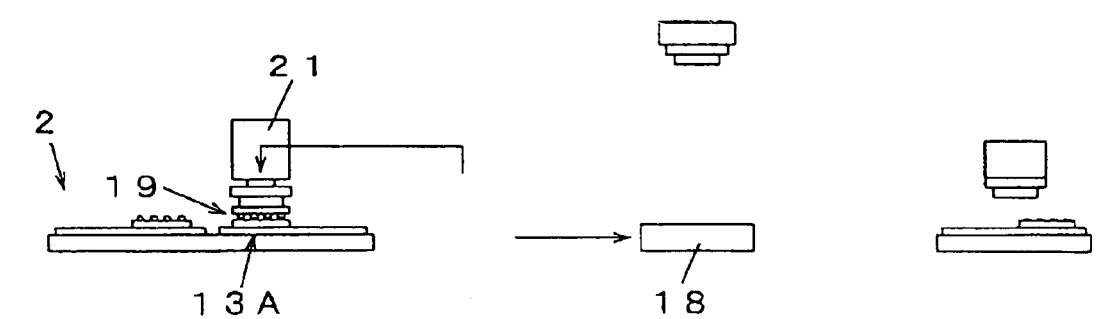

After that, holding the upper chip 15 in the integrated component 19 through the component holding nozzle 22, the integrated component 19 is stored on the first component tray 13A by moving the component transporting head 21 to the component feeding unit 2 as shown in FIG. 4D. In other words, the upper chip 15 held by the component transporting head 21 is carried out of the mounting stage 18 together with the lower chip 14 and stored on the first component tray 13A (carrying-out step).

As described above, in a component mounting apparatus of the invention, in a component mounting that the upper chip 15 is mounted the lower chip 14, the lower chip 14 is transported to the mounting stage 18 by the component transporting unit 4, subsequently, the upper chip 15 transferred from the component transporting unit 4 is mounted on the lower chip 14 by the mounting head 27. Then after mounting, the upper chip 15 is carried out by the component transporting unit 4 together with the lower chip 14. By this construction, a component mounting operation to manufacture semiconductor devices having COC structure, namely a mounting operation by bonding a pair of chip components having almost the same size each other, can be effectively performed.

In addition, according to the invention, it is not necessary to provide head used only for carrying out the component. Therefore, it is possible to simplify the apparatus structure and to reduce the cost of the apparatus. Further, by a structure provided with the transportation conveyer 31, the lower chips 14 stored in the component storage tray 32 can be effectively fed by in-line manner.

The invention provides an advantage that a component mounting operation to manufacture semiconductor devices having COC structure can be effectively performed and is therefore applicable in a field of manufacturing semiconductor devices in which another component is mounted on one component in a stacked manner.

What is claimed is:

1. A component mounting method of mounting a second component on a first component, comprising the steps of:
   a placing step of placing a first component on a mounting stage;
   a holding step of holding a second component which is transferred to a mounting head by a component transporting unit;
   a mounting step of mounting the second component held by the mounting head on the first component placed on the mounting stage; and
   a carrying-out step of carrying the second component mounted on the first component out of the mounting stage together with the first component by holding the component transporting unit.

2. A component mounting method according to claim 1, further comprising a recognizing step of recognizing, the first component that is placed on the mounting stage and the second component that is held by the mounting head by a recognizing unit.

* * * * *